United States Patent

Rupert et al.

[15] 3,645,783

[45] Feb. 29, 1972

[54] THIN FILM PLANAR RESISTOR

[72] Inventors: Robert E. Rupert, San Francisco, Calif.; Norman C. Anderson, Wellesley Hills, Mass.

[73] Assignee: Infrared Industries, Inc., Santa Barbara, Calif.

[22] Filed: June 3, 1970

[21] Appl. No.: 42,921

[52] U.S. Cl. ..............................117/212, 338/308, 338/309, 338/330, 252/518

[51] Int. Cl. ..............................H01c 7/00

[58] Field of Search ..............................338/308, 309, 330, 202; 117/212, 93.3; 252/518

[56] References Cited

UNITED STATES PATENTS

| | | | |
|---|---|---|---|
| 860,997 | 7/1907 | Steinmetz | 338/330 |
| 3,411,122 | 11/1968 | Schiller | 338/308 X |
| 3,469,227 | 9/1969 | Canegallo | 338/262 |
| 3,472,688 | 10/1969 | Hayashi | 338/308 X |
| 3,514,414 | 5/1970 | Shannon | 252/518 |
| 3,523,039 | 8/1970 | Ramsey | 117/212 |

*Primary Examiner*—E. A. Goldberg
*Attorney*—Dominik, Knechtel & Godula

[57] ABSTRACT

A planar film circuit in which a metallic oxide planar film is on a dielectric substrate, said planar film having areas of insulation comprising said metallic oxide, and areas of conduction comprising reduced metal. The planar film surface is not altered by the presence of said insulating and conducting areas. The method for forming said metallic oxide planar film circuits provides depositing said metallic oxide by reactive sputtering of a metal under vacuum in the presence of oxygen, and selectively reducing areas of said metallic oxide with hydrogren and an energy source. The method is used to obtain planar film electrical circuits having resistor and capacitor elements.

2 Claims, 5 Drawing Figures

PATENTED FEB 29 1972 3,645,783

INVENTORS
Robert E. Rupert
Norman C. Anderson
BY
Dominik, Knechtel & Godula
ATTYS.

THIN FILM PLANAR RESISTOR

This invention relates to thin planar film circuits or circuit patterns having areas of insulation and conduction; it also relates to film planar circuits having such components of conduction and insulation, as well as resistor and capacitor elements. The invention also relates to methods for making such planar film circuits.

Miniaturization of electrical apparatus has led to the recognized desirability of producing complete circuit patterns in ways which tend to more usefully employ such circuit patterns with electrical apparatus. It will be readily recognized that a complete circuit pattern, in thin film planar form, would be highly desirable. Such patterns will desirably have circuitry members or components which are insulators and conductors. It is also desirable that such circuit patterns have circuit elements of capacitance and resistance.

The art will recognize the advantages of obtaining such a thin film planar circuit pattern by improved methods which include obtaining the foregoing circuit patterns on an essentially homogenous layer of material, which planar surface is not altered by etching, providing multiplanar components, and the like. It will be readily appreciated that provision of various circuitry on the essentially planar surface provides such advantages, as well as providing a highly desirable base on which added layers of additional circuitry may be placed, as well as arrays of additional circuitries of active and passive circuit components.

The state of the art would understandably be enhanced by the provision of an improved method for making planar film circuits of the above type. Such a method would have added advantage if it could utilize well known and reliable techniques for laying down a single, homogenous metallic layer on which the circuit patterns can be formed, as by sputtering. It is also desirable to utilize the phenomenon of converting high resistivity metallic oxide to a conductive reduced metal. Such a teaching, for example, is found in U.S. Pat. No. 3,390,312. The teaching in this patent includes use of high temperatures in the process.

A single, homogenous insulating layer may be selectively reduced to form circuit components and elements under favorable conditions of lower temperatures, according to the present invention. Thus, it is possible to obtain more economical cycle times in the preparation of the circuit pattern, and to obviate problems of expansion and contraction associated with temperature extremes. Further, the circuit components and elements may be formed in a variety of patterns by more direct and economical steps which eliminate altering of the planar surface. Likewise, capacitor and reactor elements in the circuit may be trimmed through the same economical and direct steps.

It is accordingly one important object of the present invention to provide improved planar circuits and methods in which a single, homogenous metallic layer may be provided with various circuitry without altering the planar surface of the layer or film.

Another important object of the invention is to provide an improved planar film circuit method in which circuit elements and components may be formed so as to realize shorter, more economical cycle times for making such components and elements, as well as bypassing problems of expansion or contraction to the planar film from temperature extremes.

Still another important object of the invention is to provide an improved planar film circuit and method in which reliable and effective known techniques may be incorporated in the practice of the invention, including laying down a single, homogenous layer by reactive sputtering in a vacuum chamber to obtain controlled thicknesses.

Yet another important object of the invention is to provide an improved planar film circuit and method wherein a high-resistivity, single, homogenous metallic oxide layer or film is selectively reduced by hydrogen in improved ways by utilizing known masking techniques to expose areas which are to be reduced to thereby obtain areas having various values of conductivity.

A still another important object of the invention is to provide an improved planar film circuit and method whereby selected exposed areas of an insulating metallic oxide planar film are substantially reduced to the metallic form by utilizing hydrogen in conjunction with various energy sources, both operable at moderate or room temperature levels to realize the advantages of the invention. Substantially complete reduction will understandably lead to conductive areas, and incomplete reduction will understandably lead to partially conductive areas. This feature of the object permits obtaining resistor areas in the planar film. Another feature of this object permits trimming the resistor area by varying its dimensions, such as length and width through the same procedure steps.

A still another important object of the invention is to provide an improved planar film circuit and method in which capacitor elements may be formed in one or more planar films by providing conductor electrode areas desirably spaced apart by dielectric material which may be the metallic oxide or an interposed dielectric layer.

Yet another important object of the present invention is to provide an improved planar film circuit and method in which a single, homogenous metallic oxide layer or film is formed from the platinum group, particularly platinum oxide which is advantageously reduced by hydrogen in conjunction with an energy source that catalyzes the reaction at or near room temperature.

The present invention provides that a thin planar film of metallic oxide is formed on a nonconductive substrate such as glass, quartz, sapphire, or the like. While the film may be formed in various ways, it is preferred to employ the known technique of reactive sputtering in which the metal is laid down in a vacuum chamber to which oxygen is provided. The resulting metallic oxide film is built up to a desired thickness as measured by conventional means, for example, interferometry.

The substrate having the planar film of desired thickness is then selectively reduced with hydrogen by employing an energy source. The selective reduction may be realized by first masking the planar film and reducing only the exposed areas. The selective reduction may also be attained by programming a hydrogen ion beam relative to *x-y* coordinates. The hydrogen ion beam provides the required energy source as well as the hydrogen for the reduction step. In a similar manner, a laser beam may be programmed relative to *x-y* coordinates in a low-pressure hydrogen environment. The laser beam is the energy source, and the hydrogen for reduction is provided in the low-pressure environment. In general, the energy source may be a laser beam, hydrogen ion bombardment, shaped hydrogen-oxygen flame, a resistance heater, or the like. Hydrogen is provided in the environment of the reduction step when it is not a part of the energy source.

The invention may now be further considered by reference to the enclosed drawings wherein.

Figure 5:
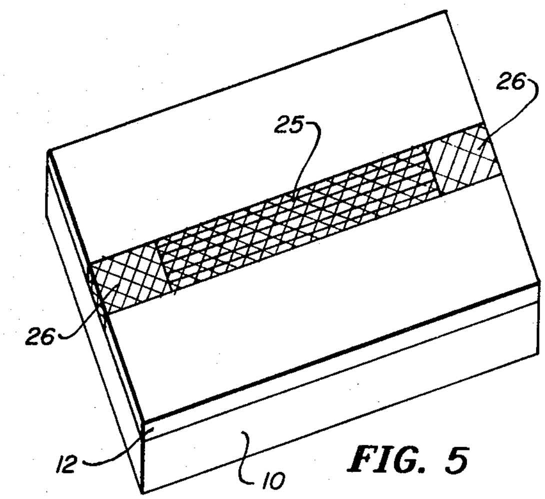
Figure 4:
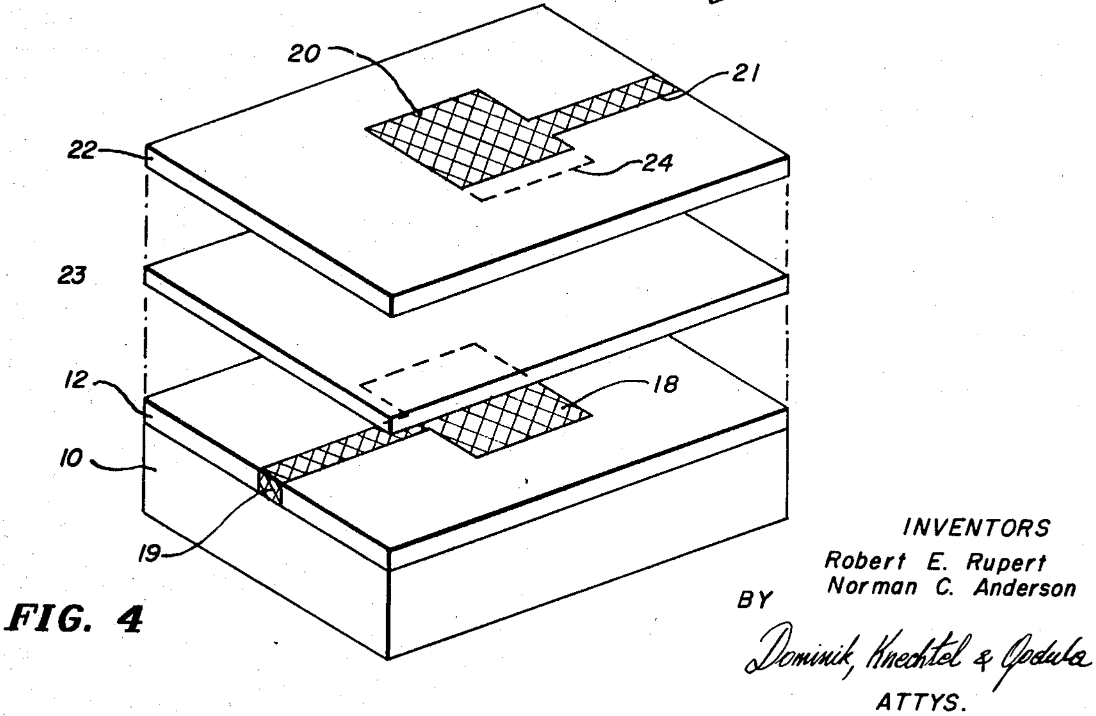

FIG. 4 is a diagrammatic planar film circuit assembly, in exploded view, showing reduced areas serving as spaced electrodes on planar films separated by a dielectric layer to obtain a capacitor element; and FIG. 5 is a diagrammatic perspective view similar to the previous views, but showing an incompletely reduced area which is partly conductive to operate as a resistor element in the planar circuit.

Figure 1:
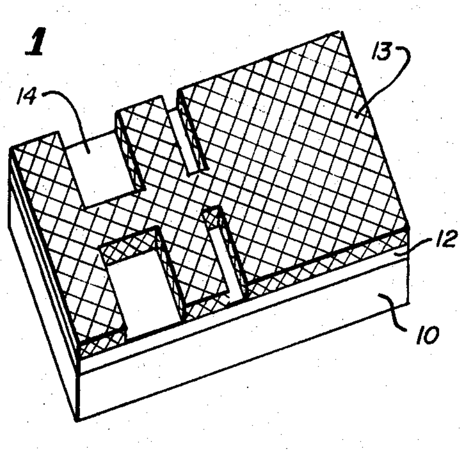
FIG. 1 is a diagrammatic perspective view of a substrate with planar film, and mask in position prior to reducing exposed areas of the planar films.
Figure 2:
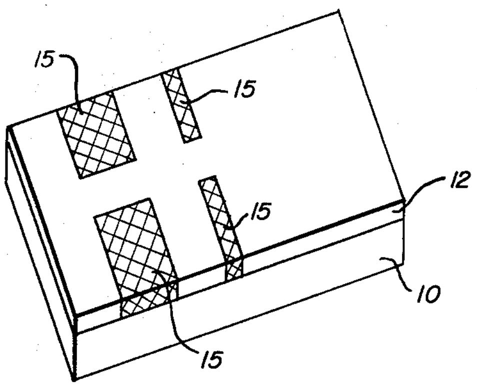
FIG. 2 is a diagrammatic perspective view similar to that shown in FIG. 1, but showing the reduced conductor areas after the reduction steps.

Planar circuit elements prepared within the scope of the present invention may now be further illustrated by reference to the drawings. FIG. 1 represents an element at an intermediate stage of the process, prior to formation of discreet areas of conduction. A substrate 10 is a dielectric body which may be glass, quartz, sapphire, or the like. The top surface of the substrate is a planar film of metallic oxide 12 formed to a desired thickness by means such as reactive sputtering. The surface of the planar film is masked by a photoresist mask 13 which is diagrammatically illustrated. This mask has a plurality of windows or openings 14 which comprise exposed areas for reducing the metallic oxide with hydrogen, such as energized hydrogen gas or a controlled energy beam, for example, hydrogen ion bombardment. The completely reduced, discreet areas 15 are shown in the view of FIG. 2, with the photoresist mask 13 removed.

Figure 3:
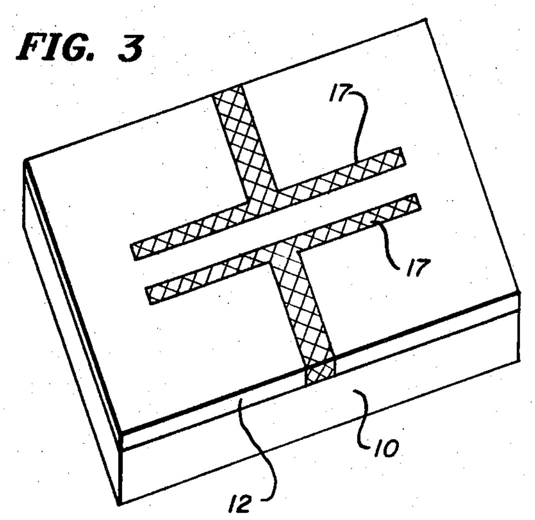
FIG. 3 is a diagrammatic perspective view of a planar film circuit similar to that shown in FIGS. 1 and 2, except the areas of conductance are presented as spaced electrodes to form a capacitor.

The view of FIG. 3 shows a capacitor element formed in a planar film circuit. The metallic oxide 12 has formed therein two generally T-shaped electrodes 17 which are spaced apart a selective distance and separated by said insulating metallic oxide material. The capacitor element may be understandably trimmed by altering the spacing between the electrodes, that is, by the amount of insulating metallic oxide therebetween.

The view of FIG. 4 shows an alternative embodiment for preparing a planar film circuit with a capacitor element according to the teachings of the invention. A first electrode 18 having a contiguous electrical connection 19 is formed in a first planar metallic oxide film 12. A second conducting electrode 20 having a similar contiguous electrical connection 21 is formed in a second metallic oxide planar film 22. The first and second metallic oxide planar films are separated by a dielectric film coating or layer 23 which is interposed therebetween. This capacitor dielectric layer is a material which will remain unaffected by the hydrogen reduction step, and may be selected from among aluminum oxide, aluminum nitride, silicone oxide, and still others. The first or base planar film 12 may have the electrode area formed by steps similar to those indicated in association with the view of FIG. 1. The electrode area in the second planar film may be similarly in the planar film has been found to be platinum. Platinum oxide is easily deposited in a thin film form by methods which include reactive sputtering of platinum in a partial pressure of oxygen. The oxide form has excellent electrical insulating properties, and platinum itself has a high affinity for hydrogen in chemically reducing the oxide form to the metallic state at the desired low-temperature range. A metal from the "platinum group" is successfully employed in the practice of the present invention, and this term is intended to include related platinum metals such as rhenium, osium, iridium; as well as related palladium metals such as masurium, ruthenium, rhodium and palladium. In general, any equivalent metal which in the oxide form attains good insulation and which can be reduced by hydrogen to the metallic form to provide a good conductor is intended to come within the term of "platinum group" metals. Nickel is an example of such an equivalent metal. In general, the practitioner may give consideration to the heavy metals in the iron, silver and gold periods of the Periodic system.

The reduction step is performed, as indicated, by employing an energized hydrogen gas with a pattern defining mask. A controlled energy beam may also be used in conjunction with a pattern mask, or, in the absence of a mask, such a beam is programmed in accordance with *x-y* coordinates. The hydrogen gas is energized by various energy sources such as resistance heating, laser beam, shaped hydrogen-oxygen flame, and by still other energy sources. The controlled energy beam may be hydrogen ion bombardment, for example. In general, the reduction reaction is conducted quickly, in terms of seconds. A slow reaction is one involving minutes. In all the reduction methods, the temperature of reduction is maintained moderate, that is, below about 140° C. Many reductions can be conducted at about 100° C. and lower. In many preferred forms, the reaction temperature is conducted at about room, or below, temperature. The reaction conditions of various operable reduction steps are summarized on the following table:

| Process | Energy source | Type mask | Substrate | Environment | Reaction temperature ° C. | Speed |
|---|---|---|---|---|---|---|
| I | Resistance heater | Photoresist | Heated | 1×10-3 torr hydrogen gas | 100–140 | Minutes. |
| II | Hydrogen ion bombardment | do | Cooled | Argon-hydrogen mix, glow discharge | Room | Seconds. |
| III | do | Contact | do | Ar-$H_2$ mix glow discharge | Room | Do. |
| IV | Laser beam | do | do | Low pressure hydrogen | 100–140 | Fast. |
| V | do | Optical image. | do | do | 100–140 | Do. |
| VI | Hydrogen-oxygen flame shaped | Contact | do | 1 atm. inert gas | 100–140 | |
| VII | X–Y programmed hydrogen ion beam. | None | do | Low pressure hydrogen | Room | Seconds. |
| VIII | X–Y programmed laser beam | do | do | do | Room | Fast. |

formed, or formed by an alternative hydrogen reduction step which utilizes an energy beam, such as a laser, in a hydrogen atmosphere. It is a further feature that the capacitor element may be trimmed by increasing the area of the second electrode, as indicated by phantom at 24. This may also be done with a high-energy beam, and this trimming operation may be advantageously performed while this circuit is electrically operating.

A resistor element is shown in the planar film circuit illustrated in FIG. 5. A discreet area 25 is partially conductive by incomplete reduction of the metallic oxide film 12. By controlling the degree of reduction, desired resistor properties are attained in the discreet area. The conductor can further be trimmed by varying the length and width of the partially reduced area, as by utilizing the energized laser beam step previously identified. The opposite ends of the resistor area 25 comprise fully reduced metallic contacts 26. The contacts 26 may be formed by a subsequent reduction step in which other areas of the planar film are masked.

The metal which operates in a highly advantageous manner

The hydrogen ion bombardment of process II and III is attained by glow discharge in the presence of argon-hydrogen mix to support the discharge. Process VI utilizes hydrogen as part of the energy source for shaped flame, therefore, only an inert gas is required for the environment. In the other listed processes, hydrogen gas is provided in the environment, generally at low pressures.

Various types of masks may be employed such as the indicated optical image mask which is a grid pattern mask interposed in an optically collimnated beam between the energy source and the metal oxide surface; thus a mask that makes no physical contact with the metal oxide layer.

Contact masks may also be used which are solid masks with circuit pattern defining openings that make physical contact with the metal oxide layer.

Photoresist masks find particular usefulness in the process, and such masks may be prepared by techniques known to the art. Generally, a substrate material is preferably attached to a photoresist spinner by means of a vacuum chuck, and the liquid photoresist materials are applied to the surface of the substrate, as by syringe. The substrate is then spun at, say, 2,000 r.p.m. for a short time of about 30 seconds to evenly spread the photoresist liquid. Such liquid contains a resin composition which is cured by baking in an oven at 80° C. for about 15 minutes. The substrate is then masked with a desired grid pattern mask so that exposed areas may be treated with ultraviolet rays to effect polymerization. The mask is removed and the substrate is placed in a developer, and then washed to remove portions of the mask not exposed to ultraviolet, that is, nonpolymerized portions. The resulting photoresist mask is provided with the openings such as 14 (FIG. 1) with exposed areas of the planar film within such openings. The liquid photoresist and developer are widely available under the trade designations "Shipley" photoresists or "Kodak" photoresists.

An additional important advantage of using moderate temperature arises in association with photoresist masks as described herein. Higher temperatures would cause serious hardening of the photoresist material which would make subsequent removal a difficult problem. Operating at the desired temperature levels, of less than 140° C., prevents the occurrence of such undue hardening of the photoresist material. According to the steps of the present invention, successful reduction can occur with photoresist masks, and such masks may be subsequently removed simply by conventional means such as ultrasonically agitating a solvent such as trichlorethylene and acetone, and placing the substrate with photoresist masks in such an agitated body of liquid.

The following example is presented to illustrate the mode now best contemplated to practice the invention, but it should be understood that examples should be considered only as representative. It should further be appreciated that other and better modes may be devised within the scope of the present invention.

EXAMPLE

A quartz substrate is cleaned with a mild detergent solution to free it of grease and dust. The substrate is then placed in a high-vacuum coating chamber containing pure platinum target and glow discharge configuration. The coating chamber is evacuated to a pressure of $1 \times 10^{-4}$ torr or better, and a 70/30 mixture of oxygen-argon gas is introduced into the chamber as a controlled leak at a pressure of 10 to 30 millitorr to maintain a stable glow discharge.

The deposition rate of the film in the chamber is about from 50 to 100 angstrons per minute, the partial pressure of the oxygen is maintained at 30 millitorr, and the quartz substrate temperature is maintained from about 50° to about 60° C.

A photoresist mask is applied to the platinum oxide planar film in the manner previously described, and the desired circuit configuration will be represented by windows or openings in the mask.

The hydrogen reduction is then conducted, and the conversion of platinum oxide to platinum in this process yields a polycrystalline platinum. The resolution of the platinum—platinum oxide boundary is very fine and limited only by mask tolerance and fit, or beam spot size where used. Use of the hydrogen ion bombardment according to process II in the foregoing table produces line widths of 0.0005 to 0.003 inch. Still narrower line widths and higher resolutions are obtainable. The reduction step leads to the resistivity of the film decreasing many of orders of magnitude, typically from $10^9$ ohms per square or even greater, to a $2\times10^1$ ohms per square, or even less. The degree of conductivity is in great part dependent upon the initial film thickness and the degree of completion of the chemical reduction. The platinum oxide film prepared according to the present example, is reduced by utilizing hydrogen ion bombardment according to process II in the foregoing table. A radio frequency or RF sputtering system is employed using a mixture of argon and hydrogen gas of 70/30 proportions, although other proportions are operable. The platinum oxide planar film coated substrate and mask are attached to the cathode target holder with the oxide surface exposed to the hydrogen ion plasma. The gas pressure is adjusted to initiate a glow discharge, but such pressure levels are not in any sense critical because of the very short bombardment time, say about 20 seconds. The reduction technique with energized hydrogen ion is similar to the ion etching technique which is well established in the art. Following completion of the reduction step, the photoresist mask is removed by placing the circuit element in a body of trichlorethylene which is ultrasonically agitated to obtain good scrubbing action.

The claims of the invention are now presented.

1. A planar film electrical circuit, including a dielectric substrate, a planar film surface on said substrate, said planar film having an area of insulation which is an oxide of a metal selected from the class consisting of platinum, rhenium, osium, irridium, masarium, ruthenium, rhodium and palladium, said planar film having an incompletely reduced area of said metal oxide to provide a partly conductive area operative as a resistor element, said planar film having an area of conductance contiguous to said incompletely reduced area, said area of conductance being only a metal of the identity corresponding to said metal oxide area, and said areas not altering the planar surface of the film.

2. A planar film circuit as in claim 1 wherein said area of insulation is platinum oxide, said incompletely reduced area is platinum oxide partially reduced to platinum, and wherein said area of conductance is reduced platinum.

* * * * *